United States Patent
Clotteau

(10) Patent No.: US 7,535,973 B2
(45) Date of Patent: May 19, 2009

(54) CORRECTION METHOD AND CORRECTION LOOP FOR A COMPLEX DIGITAL SIGNAL

(75) Inventor: Bruno Clotteau, Beynes (FR)

(73) Assignee: Thales, Neuilly sur Seine (FR)

( * ) Notice: Subject to any disclaimer, the term of this patent is extended or adjusted under 35 U.S.C. 154(b) by 508 days.

(21) Appl. No.: 10/539,618

(22) PCT Filed: Dec. 15, 2003

(86) PCT No.: PCT/EP03/51002

§ 371 (c)(1),
(2), (4) Date: Jun. 17, 2005

(87) PCT Pub. No.: WO2004/055969

PCT Pub. Date: Jul. 1, 2004

(65) Prior Publication Data

US 2007/0053464 A1 Mar. 8, 2007

(30) Foreign Application Priority Data

Dec. 17, 2002 (FR) .................................. 02 16006

(51) Int. Cl.
*H04K 1/02* (2006.01)

(52) U.S. Cl. ................ 375/296; 330/127; 330/136; 330/149; 330/268; 330/274; 375/297; 375/308; 375/254; 455/114.3; 455/63.1

(58) Field of Classification Search .................. 375/296
See application file for complete search history.

(56) References Cited

U.S. PATENT DOCUMENTS

| 4,194,154 | A   |    | 3/1980  | Kahn         |           |
|-----------|-----|----|---------|--------------|-----------|
| 5,249,201 | A   |    | 9/1993  | Posner       |           |
| 5,838,210 | A   |    | 11/1998 | Midya        |           |
| 6,449,465 | B1  |    | 9/2002  | Gailus       |           |
| 6,600,792 | B2  | *  | 7/2003  | Antonio et al. | 375/297 |
| 6,947,713 | B2  | *  | 9/2005  | Checoury et al. | 455/126 |
| 7,136,628 | B2  | *  | 11/2006 | Yang et al.  | 455/114.3 |
| 7,346,122 | B1  | *  | 3/2008  | Cao          | 375/296   |

* cited by examiner

*Primary Examiner*—Shuwang Liu
*Assistant Examiner*—Dhaval Patel
(74) *Attorney, Agent, or Firm*—Lowe Hauptman Ham & Berner, LLP

(57) ABSTRACT

A method and apparatus for correcting the delay between the phase and the envelope of a digital signal are described. In particular, the application of this correction in digital broadcasting transmitters is described. The present invention makes it possible to offer an alternative solution in which the use of the initial signal is not necessary. No temporal comparison with the initial signal is necessary. A subject of the invention is a method of correcting at least one parameter to be corrected pc of the envelope of a digital signal including the decomposition of the digital signal into an envelope signal and a phase signal and the determination of the corrector to be applied to the parameter of the envelope by searching for the minimum out-of-band noise powers of the signal.

11 Claims, 3 Drawing Sheets

CORRECTION METHOD AND CORRECTION LOOP FOR A COMPLEX DIGITAL SIGNAL

CROSS-REFERENCE TO RELATED APPLICATIONS

The present application is based on International Application No. PCT/EP03/51002 filed on Dec. 15, 2003, which in turn corresponds to FR 0216006 filed Dec. 17, 2002, and priority is hereby claimed under 35 USC §119 based on these applications. Each of these applications is hereby incorporated by reference in their entirety into the present application.

FIELD OF THE INVENTION

The invention relates to the correction of the delay between the phase and the envelope of a digital signal. In particular, it relates to the application of this correction in digital broadcasting transmitters.

BACKGROUND OF THE INVENTION

U.S. Pat. No. 488,255 proposes a system for transmitting a complex signal comprising a data transmission signal component and an AM broadcast signal component. The transmitters using the method of Kahn, in particular, that described by patent U.S. Pat. No. 488,255 for the transmission of an AM broadcast signal, comprise separate means of processing of the envelope and of the phase and a multiplier of the envelope signal and of the phase signal at the output.

In digital modulation, the phase channel is not as in AM a pure RF frequency but a phase modulated RF frequency. As the envelope signal and the phase signal are processed by different and independent means, the delay between these two signals, envelope and phase, must be accurately tailored to obtain an RF output signal of high quality.

A loop allows automatic elimination and dynamic adjustment of the delay between the envelope signal and the phase signal.

The technique generally used in loops is to compare in the time domain the initial baseband signal with the demodulated transmitted RF signal. To do this, the delay between the two signals, initial and demodulated transmitted, is evaluated accurately. Then, the envelope and phase parts, in digital mode, of the two signals, initial and demodulated transmitted, are compared to determine the delay between envelope and phase.

SUMMARY OF THE INVENTION

The present invention makes it possible to offer an alternative solution in which the use of the initial signal is not necessary. No temporal comparison with the initial signal is necessary.

A subject of the invention is a method of correcting at least one parameter to be corrected pc of the envelope of a digital signal comprising the following steps:
  the decomposition of the digital signal into an envelope signal and a phase signal,
  the determination of the corrector to be applied to the parameter of the envelope by searching for the minimum out-of-band noise powers of the signal.

Another subject of the invention is a loop for correcting at least one parameter to be corrected pc of the envelope of a digital signal comprising:
  an input on which it receives the digital signal,
  a calculation system linked directly or indirectly to this input, and comprising:
    means of decomposition of the signal into two signals, envelope and phase, and
    means of determining the corrector to be applied to each parameter to be corrected pc of the envelope by searching for the minimum out-of-band noise powers of the signal,
  a correction device intended to be deployed in a chain for processing the digital signal, and linked to the calculation system which provides it with at least one corrector.

According to the variant of the invention, the parameters to be corrected are a delay and/or an offset of the envelope signal with respect to the phase signal of the digital signal, and/or a nonlinearity of the envelope signal, and the correctors are, respectively, an inverse delay and/or an inverse offset and/or a precorrection.

The invention also proposes a transmitter comprising a modulator and the correction loop comprising the input receiving a modulated digital signal, a demodulator between the input and the calculation system, and the correction device intended to be deployed in a modulator with which the demodulator is associated.

In a first variant of the transmitter according to the invention, the transmitter is a linear transmitter.

In a second variant of the transmitter according to the invention, the transmitter comprises means of decomposition of the demodulated digital signal into an envelope signal and a phase signal, in particular by implementing the method of Kahn. separate means of processing of the phase and of the envelope of the modulated digital signal.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

BRIEF DESCRIPTION OF THE DRAWINGS

The characteristics and advantages of the invention will become more clearly apparent on reading the description, given by way of example, and the figures appended thereto which represent.

DETAILED DESCRIPTION OF THE INVENTION

Figure 1:
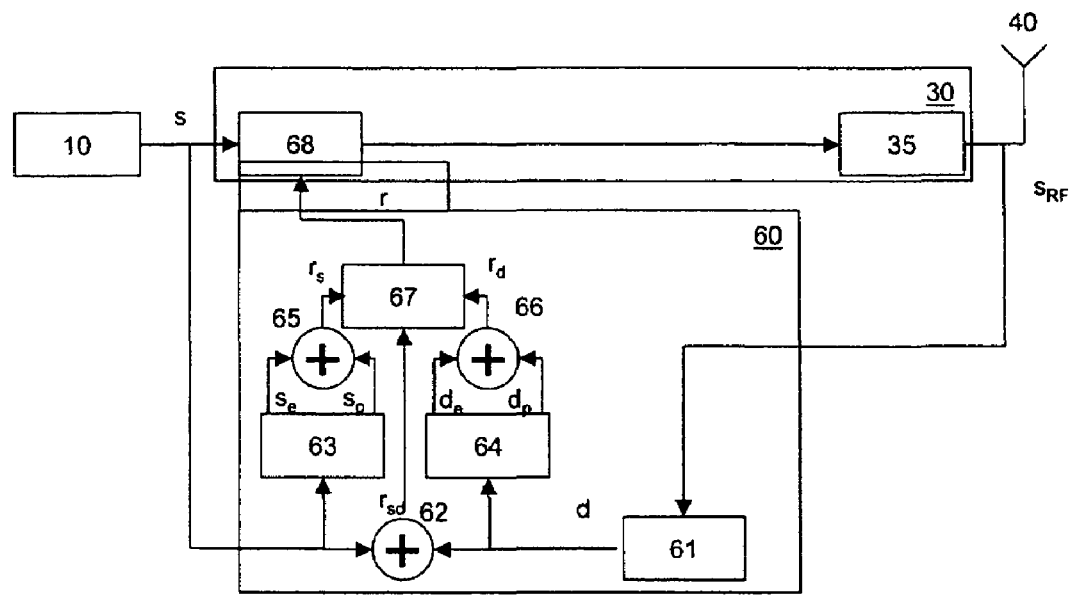
FIG. 1, transmitter with loop for correcting the delay between the envelope and the phase according to the state of the art, FIG. 2a and FIG. 2b, diagrammatic representations of the criterion of determination of the corrector according to the invention, FIG. 2a illustrating the determination of the minimum of the power of the out-of-band noise and FIG. 2b, the concept of criterion of optimization of the shoulders of the spectrum, FIG. 3, an example of a block diagram of the method of correction according to the invention, FIG. 4, an example of a correction loop according to the invention, FIG. 5, an example of a transmitter using the method of Kahn and comprising the correction loop according to the invention, FIG. 6, an example of a linear transmitter comprising the correction loop according to the invention.

FIG. 1 shows a transmitter implementing the technique, generally used in the loops 60. The signal processing device provides the baseband signal to the transmission device 30 which transmits it in the form of a radiofrequency (RF) signal $S_{RF}$ via an antenna 40. The delay between the envelope e and the phase p is corrected with the aid of the correction loop 60.

The correction loop 60 comprises a demodulator 61 associated with the modulator 30. The demodulator 61 receives the signal such as it will be transmitted, that is to say the RF signal $S_{RF}$, and provides the demodulated signal d. The demodulated transmitted RF signal d is compared with the baseband signal s in the time domain by the comparison device 62 so as to evaluate accurately the delay $r_{sd}$ between the demodulated transmitted RF signal d and the baseband signal s.

Thereafter, the two decomposition devices 63 and 64 separate, respectively, a demodulated transmitted RF signal d and the baseband signal s into their envelope and phase parts (in digital mode) ($d_e$, $d_p$) and ($s_e$, $s_p$). The comparison device 65, respectively the comparison device 66, determines the delay $r_s$ between the envelope and phase parts ($s_e$, $s_p$) of the baseband signal s, respectively the delay $r_d$ between the envelope and phase parts ($d_e$, $d_p$) of the demodulated transmitted RF signal d.

The processing device 67 receives all of its delays $r_{sd}$, $r_s$ and $r_d$ so as to determine as accurately as possible the delay r allowing the device 68 to perform the correction of the delay between the envelope e and the phase p within the modulator 30. The modulator 35 then transposes the baseband signal s into RF signal $S_{RF}$.

This correction loop 60 allows automatic compensation and dynamic adjustment of the delay between the envelope channel e and the phase channel p.

The invention proposes to determine the delay between the envelope e and the phase p with the aid of another criterion such that the correction loop 60 does not need the baseband signal s to perform this determination. This criterion may furthermore be applied to the correction of other parameters $p_c$ of the envelope e of the signal, in particular to the offset between the envelope e and the phase p or to a nonlinearity of the envelope e defined by its parameters [$a_0$, $a_1$, ... $a_n$]. The invention therefore proposes in a general manner to determine the corrector c, regardless of the type of parameter to be corrected pc.

Figure 2A:
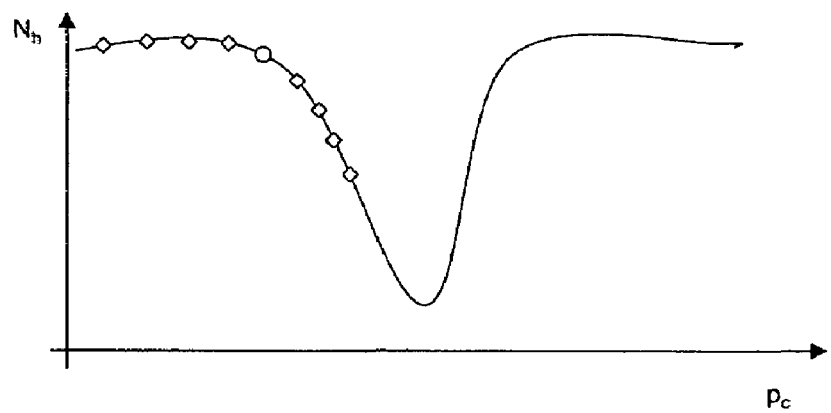

The determination of the corrector is illustrated by FIG. 2a. The determination of the corrector is effected by searching for the minimum of the power of the out-of-band noise $N_h$ of the signal, transmitted reduced to baseband if appropriate, $$d = I + jQ = e_{er} e^{jp_{er}} \text{ where } e_{er} = \sqrt{I^2 + Q^2} \text{ and } p_{er} = (I + jQ)/e_{er}.$$

Depending on whether one is seeking solely to determine the corrector of the delay or of the offset, or the corrector of several parameters to be corrected such as the delay and/or the offset and/or the parameters [$a_0$, $a_1$ ... $a_n$] of the nonlinearity, one searches for the minimum of a function with one or more variables, for example $N_h = f_1$(delay), $N_h = f2$(offset), Nh=f3 (delay, offset), $N_h = f4(a_0, a_1, ... a_n)$, etc. The determination of this minimum of a function is effected by using the existing mathematical tools.

In a simple variant of the method of determining a single corrector by searching for the minimum of the power of the out-of-band noise $N_h$, various predetermined correctors c are applied successively to the envelope $e_{er}$. The two signals, corrected envelope $e'_{er}$ and phase $p_{er}$, are multiplied. The resulting signal d' is then transposed into the frequency domain, by Fourier transformation (FFT) in particular, for the calculation of the noise power $N_h$. This power may also be evaluated in the time domain. The comparison of the power of the noise $N_h$ for the various predetermined correctors applied (illustrated by diamonds in FIG. 2a, the circle illustrating the parameter to be corrected pc at the outset) makes it possible to determine that one of the predetermined correctors for which the power of the noise $N_h$ is the smallest.

Another example: the evaluation of the delay may be performed by sample shifting. This procedure possibly having too coarse an interval of definition of the delay, it is possible to refine the accuracy with the aid of delaying filters.

Figure 2B:
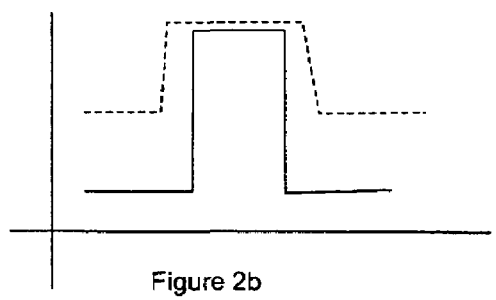

The determination of the corrector or correctors by searching for the minimum of the out-of-band noise power $N_h$, allows a correction which is illustrated in terms of spectrum by a switch from the spectrum shown dashed with high shoulders to a spectrum shown by a solid line with low shoulders as shown by FIG. 2b. This is why the criterion for determining the corrector or correctors is called, hereinafter, the criterion for optimizing the shoulders of the spectrum.

Figure 3:
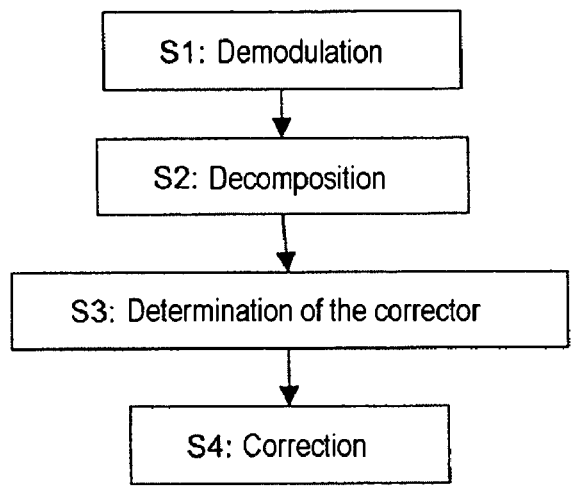

FIG. 3 illustrates the method of correcting at least one parameter to be corrected pc of the envelope e of a digital signal s characterized in that it comprises the following steps:

[S2] the decomposition of a digital signal $s_{er}$ into two signals, envelope $e_{er}$ and phase $p_{er}$,

[S3] the determination of the corrector c to be applied to each parameter to be corrected pc of the envelope $e_{er}$ by searching for the minimum out-of-band noise powers $N_h$,

[S4] the correction of the signal $s_{er}$ by the corrector c.

When the signal $s_{er}$ is a modulated signal, the method furthermore comprises the step [S1] of demodulation before the step [S2] of decomposition of the demodulated signal d obtained during step [S1] on the basis of the signal $s_{er}$.

Step [S3] of determining corrector(s) c may comprise the existing mathematical tools for searching for the minimum of a function with one or more variables. This function whose minimum is sought is that of the power of the out-of-band noise $N_h$, for example $N_h = f_1$(delay), Nh=f2(offset), Nh=f3 (delay, offset), Nh=f4($a_0$, $a_1$ ... $a_n$) where the parameters [$a_0$, $a_1$ ... $a_n$) are those of a nonlinearity of the envelope $e_{er}$, etc.

Step [S3] of determination of corrector(s) c may thus comprise the following substeps (not illustrated in FIG. 3):

S[31] a successive application of various predetermined values {$C_1$ to $C_M$} of the corrector c to the envelope $e_{er}$,

[S32] a multiplication of the corrected envelope $e'_{er}$ and of the phase $p_{er}$ for each value {$C_1$ to $C_M$} of the corrector c,

[S33] a transposition into the frequency domain of the signals thus obtained for each of the predetermined values {$C_1$ to $C_M$} of the corrector c (corresponding to the diamonds of FIG. 2a),

[S33] the comparison of the out-of-band noise powers $N_h$ for each of the predetermined values {$C_1$ to $C_M$} of the corrector c, the value adopted for c being that corresponding to the smallest out-of-band noise power.

Figure 4:
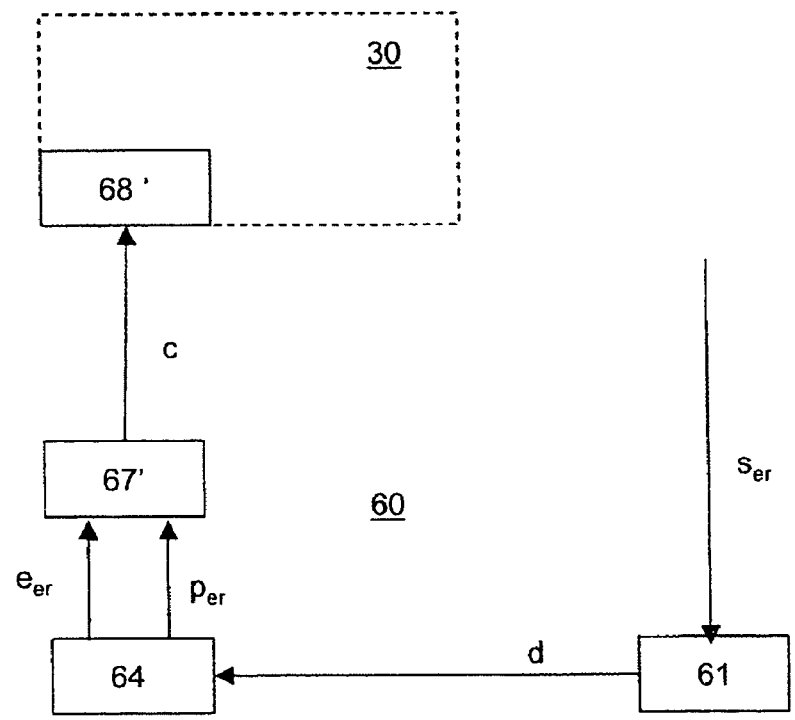

FIG. 4 shows an example of a correction loop 60 according to the invention. The signal $s_{er}$, at least one of whose parameters is to be corrected, is on an input of the loop 60.

The method of correction according to the invention is such that the initial baseband signal is not necessary. This is why the correction loop 60 may comprise this input alone receiving the digital signal $s_{er}$ having at least one parameter to be corrected $p_c$.

The correction loop comprises a calculation system linked directly or indirectly to this input.

In the example of FIG. 4, the signal $s_{er}$ is a modulated signal. In this case, the correction loop 60 comprises a demodulator 61 receiving this signal $s_{er}$ and providing the corresponding demodulated signal d. The signal thus demodulated d is presented to the calculation system.

When the signal $s_{er}$ is a baseband signal, the latter is presented directly to the calculation system. The correction loop 60 then comprises no demodulator 61.

The calculation system comprises means of decomposition 64 of the signal which is presented to it $s_{er}$ or d (according, respectively, to whether $s_{er}$ is in baseband or modulated) into two signals, envelope $e_{er}$ and phase $p_{er}$.

The calculation system furthermore comprises means of determination of the corrector c 67' to be applied to each parameter to be corrected pc. The means of determination of the corrector c 67' receive the envelope $e_{er}$ and the phase $p_{er}$ from the decomposition means 64. The criterion applied by these determination means 67' is that of optimization of the shoulders of the spectrum. To do this, the means of determination 67' implement the mathematical tools existing for searching for a minimum of a function, in this instance of the out-of-band noise power $N_h$.

The parameters to be corrected $p_c$ are a delay and/or an offset of the envelope signal $e_{er}$ with respect to the phase signal $p_{er}$ of the digital signal, and/or a nonlinearity of the envelope signal $e_{er}$, and the correctors c are, respectively, an inverse delay and/or an inverse offset and/or a precorrection.

The means of determination 67' of the calculation system provide a correction device 68' with the corrector(s) c which it has determined. The correction device 68' is intended to be deployed in a digital signal processing chain. In the example of FIG. 4, the correction device 68' is intended to be deployed in a modulator 30 with which the demodulator 61 is associated.

Such a correction loop may be deployed in various types of transmitter, for example transmitters using the method of Kahn, linear transmitters, etc. It is in particular beneficial for any type of conventional AM transmitter using the Kahn method of modulation.

The correction loop 60 thus allows automatic compensation and dynamic adjustment of parameter, in particular of the delay between the envelope $e_{er}$ and the phase $p_{er}$. They are undertaken by a demodulator 61, for example an RF demodulator as illustrated in FIGS. 5 and 6, and a correction device 68', in particular dynamic precorrection software, deployed in the modulator 30, in particular in the chip 31 of this modulator.

Figure 5:
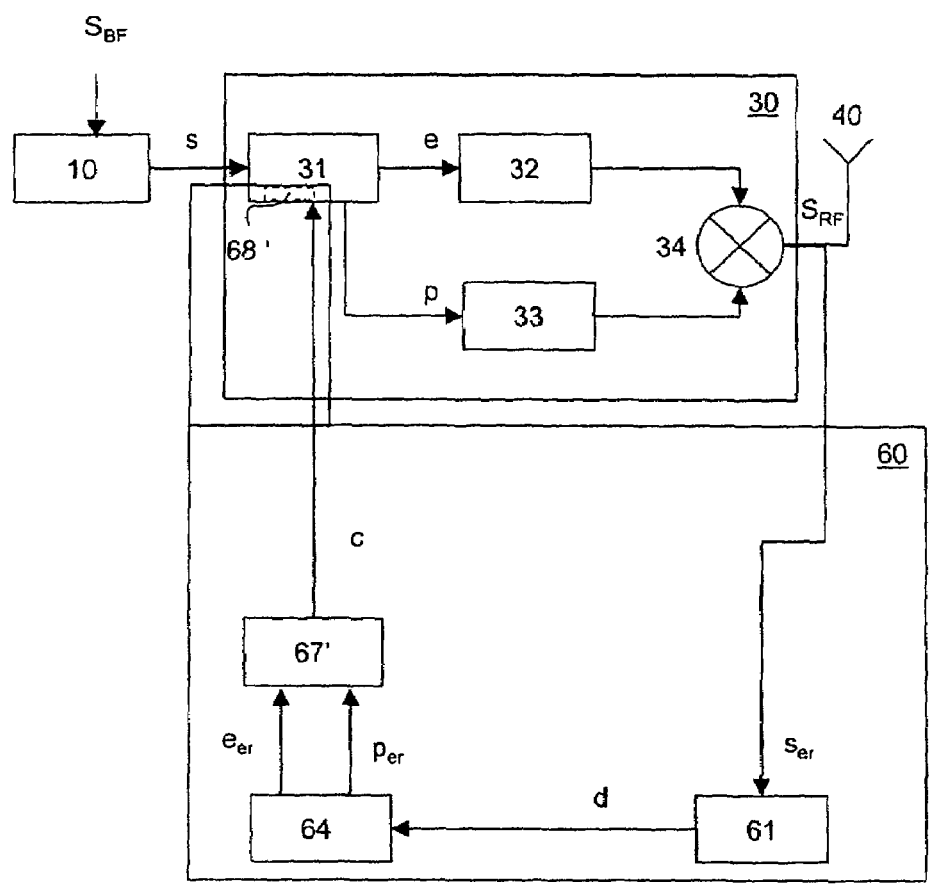
Figure 6:
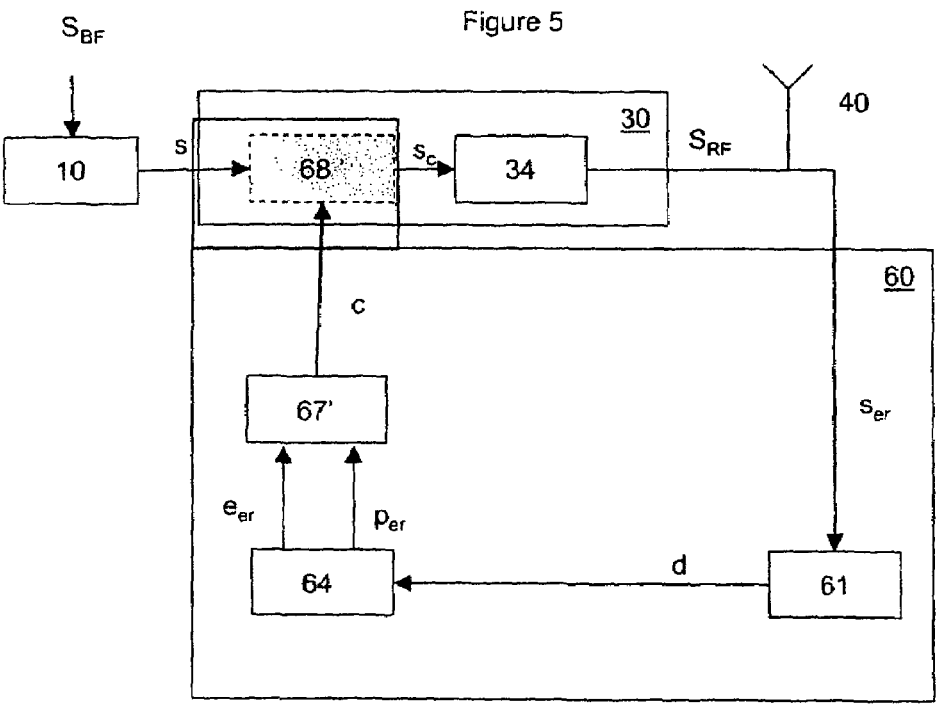

FIG. 5 illustrates a transmitter using the method of Kahn comprising a correction loop according to the invention. The correction loop 60 then undertakes dynamic adjustment with automatic elimination and allows quality out-of-band transmission regardless of the frequency or the mode of forwarding selected.

The signal processing device 10 receives the low frequency signal $S_{BF}$ and provides the corresponding baseband signal s. The digital baseband signal s is a complex signal.

The majority of the most efficient radiobroadcasting transmitters use the Kahn method of modulation which involves processing the envelope e and the phase p separately (32, 33) and recombining (34) these two signals e and p at the output.

The modulator 30 using the method of Kahn is illustrated by FIG. 5. The baseband signal s is processed by the calculation device 31 which separates this signal into an envelope signal e and a phase signal p. The processing devices 32 and 33 then operate on, respectively, this envelope signal e and this phase signal p. The multiplier 34 then recombines these two envelope e and phase p signals into a signal $S_{RF}$. The signal $S_{RF}$ is transmitted via the antenna 40.

As the envelope e and the phase p are processed by two different and independent paths, respectively 32 and 33, various parameters between these two paths, in particular the delay, must be tailored accurately in order to obtain an RF signal $S_{RF}$ of high quality with an acceptable level of the out-of-band noise power $N_h$.

Let us consider the parameter to be tailored as being the delay. Taking into consideration that the processing time is not constant and may vary, in particular as a function of the operating mode and of the frequency, and taking into consideration the high sensitivity of this tailoring on the final quality of the digital RF signal transmitted, a correction loop 60 according to the invention is deployed in this transmitter. This correction loop 60 allows automatic compensation and dynamic adjustment of the delay.

After a possible manual preadjustment during the phase of bringing into service of the transmitter, this option constituted by the correction loop 60 according to the invention is capable of executing the automatic elimination and dynamic adjustment of the delay so as to cope with the possible variations in delay time due to the changes of conditions of use (mode, frequency, etc.).

To execute this automatic elimination and dynamic adjustment of the delay r, an RF sample $s_{er}$ taken at the output of the transmitter is demodulated 61 and processed 64, 67'. A digital precorrection 68' is applied directly to the baseband signal s so as to have an optimized result at the output of the transmitter. The digital processing may be performed iteratively to obtain the best possible result.

The correction loop 60 deployed in the transmitter using the Kahn method of modulation, an example of which is proposed by FIG. 5, has its input linked to the output of the transmitter to receive the RF sample $s_{er}$ of the transmitted signal $S_{RF}$. Its demodulator 61 s provides the means of decomposition 64 into envelope $e_{er}$ and phase $p_{er}$ signals with the demodulated signal d. Its means of determination 67' of the corrector c of the delay r process the envelope $e_{er}$ and phase $p_{er}$ by searching for the minimum of the out-of-band noise power $N_h$, and forward the corrector c to the correction device 68' deployed in the calculation device 31 of the modulator 30 so that it effects the correction.

These means of determination 67' and this correction device 68' are also capable of determining the corrector(s) of the offset of the envelope signal $e_{er}$ with respect to the phase signal $p_{er}$ and a nonlinearity of the envelope signal $p_{er}$. The determination and the correction of each of these parameters: delay, offset, nonlinearity may be performed separately or in combination.

FIG. 6 illustrates a linear transmitter (Class A or B) comprising a correction loop according to the invention. The signal processing device 10 receives the low frequency signal' $s_{BF}$ and provides the corresponding baseband signal s. The digital baseband signal s is a complex signal.

The modulator 30 of a linear transmitter is illustrated by FIG. 5. The baseband signal s is transposed into radio frequency: signal $S_{RF}$ the device 35. The signal $S_{RF}$ is transmitted via the antenna 40.

Let us consider the parameters to be tailored as being the parameters of a nonlinearity of the envelope e. The correction loop 60 allows the automatic compensation and dynamic adjustment of this nonlinearity.

To execute this automatic compensation and dynamic adjustment of this nonlinearity, an RF sample $s_{er}$ taken at the output of the transmitter is demodulated 61 and processed 64, 67'. A digital precorrection 68' is applied directly to the baseband signal s so as to have an optimized result at the output of the transmitter. The digital processing may be performed iteratively to obtain the best possible result.

The correction loop 60 deployed in the linear transmitter, an example of which is proposed by FIG. 6, has its input linked to the output of the transmitter to receive the RF sample $s_{er}$ of the transmitted signal $S_{RF}$. Its demodulator 61 s provides the means of decomposition 64 into envelope $e_{er}$ and phase $p_{er}$ signals with the demodulated signal d. Its means of determination 67' of the corrector c of the nonlinearity process the envelope $e_{er}$ and phase $p_{er}$ by searching for the minimum of the out-of-band noise power $N_h$, and forward the corrector c to the correction device 68' deployed in the calculation device 31 of the modulator 30 so that it effects the correction.

These means of determination 67' and this correction device 68' are also capable of determining the corrector(s) of the delay and/or of the offset of the envelope signal $e_{er}$ with respect to the phase signal $p_{er}$. The determination and the correction of each of these parameters: delay, offset, nonlinearity may be performed separately or in combination.

The transmitters, in particular those using the Kahn modulation and the linear transmitters, comprising such a transmitter correction loop 60 may be used for the radiobroadcasting or telebroadcasting of digital signals.

The correction loop 60 according to the invention may be more generally used in all applications a complex digital signal comprising one or more parameter to be corrected. Particularly, this correction loop 60 is well suited when no initial signal is available as comparison element.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. A method of correcting at least one parameter to be corrected of a complex digital signal ($s_{er}$, d) comprising the following steps:
    a decomposition of the signal into two signals, envelope ($e_{er}$) and phase ($p_{er}$) using decomposition device,
    a determination of a corrector c to be applied to the parameter of the envelope, said corrector being obtained by searching, among predetermined values, for the value of the corrector corresponding to a minimum of an out-of-band noise power ($N_h$) of an output signal of a digital signal processing chain comprising a correction as a function of said corrector, the complex digital signal ($s_{er}$, d) being the only necessary signal to determine the corrector c, the step of determination of the corrector c comprising the following substeps:
    a successive application of various predetermined values $\{C_1$ to $C_M\}$ of the corrector c to the envelope $e_{er}$ to generate a corrected envelope $e'_{er}$,
    a multiplication of the corrected envelope $e'_{er}$ and of the phase $P_{er}$ for each value $\{C_1$ to $C_M\}$ of the corrector c,
    a transposition into a frequency domain of signals thus obtained for each of the predetermined values $\{C_1$ to $C_M\}$ of the corrector c,
    comparing the out-of-band noise powers $N_h$ for each of the predetermined values $\{C_1$ to $C_M\}$ of the corrector c, the value adopted for corrector c being that corresponding to a smallest out-of-band noise power.

2. A loop for correcting at least one parameter to be corrected of a complex digital signal ($s_{er}$, d) comprising:
    an input on which it receives the digital signal ($s_{er}$, d),
    a calculation system linked directly or indirectly to this input,
    a correction device (68') deployed in a chain for processing the digital signal, and linked to the calculation system which provides it with at least one corrector (c),
    the input being the only input, the calculation system being configured in such a way that it comprises:
    means of decomposition (64) of the signal into two signals, envelope ($e_{er}$) and phase ($p_{er}$), and
    means of determining (67') the corrector c to be applied to each parameter to be corrected ($p_c$) of the envelope by searching, among predetermined values, for the value of the corrector corresponding to the minimum out-of-band noise power ($N_h$) of an output signal of a digital signal processing chain comprising a correction as a function of said corrector, the means of determining (67') the corrector c being able to:
    apply successively various predetermined values $\{C_1$ to $C_M\}$ of the corrector c to the envelope $e_{er}$ to generate a corrected envelope $e'_{er}$,
    multiply the corrected envelope $e'_{er}$ and the phase $p_{er}$ for each value $\{C_1$ to $C_M\}$ of the corrector c,
    transpose signals thus obtained for each of the predetermined values $\{C_1$ to $C_M\}$ of the corrector c into a frequency domain,
    compare the out-of-band noise powers $N_h$ for each of the predetermined values $\{C_1$ to $C_M\}$ of the corrector c, the value adopted for corrector c being that corresponding to a smallest out-of-band noise power.

3. The correction loop as claimed in the claim 2, wherein the parameters to be corrected ($p_c$) comprise a delay and the correctors (c) comprise an inverse delay.

4. The correction loop as claimed in the claim 2, wherein the parameters to be corrected ($p_c$) comprise an offset of the envelope signal with respect to the phase signal of the digital signal and the correctors (c) comprise an inverse offset.

5. The correction loop as claimed in the claim 2, wherein the parameters to be corrected ($p_c$) comprise a nonlinearity of the envelope signal, and the correctors (c) comprise a precorrection.

6. The correction loop as claimed in the claim 2, wherein the digital signal is a modulated digital signal ($S_{RF}$) and in that the loop comprises:
    a demodulator (61) between the input and the calculation system,
    the correction device (68') intended to be deployed in a modulator (30) with which the demodulator (61) is associated.

7. A transmitter comprising the modulator and the correction loop (60) as claimed in the claim 6.

8. The transmitter as claimed in the claim 7, wherein it is a linear transmitter.

9. The transmitter as claimed in claim 7, wherein it comprises separate means of processing (32, 33) of the phase and of the envelope of the modulated digital signal.

10. The transmitter as claimed in the claim 9, wherein the modulator (30) comprises separate means of processing of the envelope and of the phase and a multiplier of the envelope signal and of the phase signal at the output.

11. The use of the transmitter as claimed in the claim 6, for a radio broadcasting or telebroadcasting of digital signals.

* * * * *